United States Patent
Kimura et al.

(10) Patent No.: US 8,120,349 B2
(45) Date of Patent: *Feb. 21, 2012

(54) WAVEFORM MEASURING APPARATUS WHEREIN THE PEAK-TO-PEAK AMPLITUDE IS MEASURED

(75) Inventors: Tomoaki Kimura, Fujisawa (JP); Tadayuki Okada, Machida (JP)

(73) Assignee: International Business Machines Corporation, Armonk, NY (US)

( * ) Notice: Subject to any disclaimer, the term of this patent is extended or adjusted under 35 U.S.C. 154(b) by 836 days.

This patent is subject to a terminal disclaimer.

(21) Appl. No.: 12/129,035

(22) Filed: May 29, 2008

(65) Prior Publication Data

US 2008/0228448 A1  Sep. 18, 2008

Related U.S. Application Data

(63) Continuation of application No. 11/566,838, filed on Dec. 5, 2006, now Pat. No. 7,414,387.

(30) Foreign Application Priority Data

Dec. 5, 2005  (JP) ................................. 2005-351037

(51) Int. Cl.
G01R 23/16 (2006.01)
G01D 1/14 (2006.01)
(52) U.S. Cl. .................................. 324/76.12; 324/76.13
(58) Field of Classification Search .............. 324/76.12; 709/191
See application file for complete search history.

(56) References Cited

U.S. PATENT DOCUMENTS

| 4,362,394 | A | * | 12/1982 | Menlove ........................ 368/118 |
| 4,623,837 | A | | 11/1986 | Efron et al. |
| 5,555,190 | A | * | 9/1996 | Derby et al. ..................... 702/45 |
| 6,256,157 | B1 | * | 7/2001 | Biskeborn et al. .............. 360/31 |
| 6,795,588 | B1 | | 9/2004 | Nio et al. |
| 7,205,769 | B2 | | 4/2007 | Fujiwara |
| 7,398,169 | B2 | * | 7/2008 | Yamaguchi et al. ............ 702/69 |
| 7,414,387 | B2 | * | 8/2008 | Kimura et al. ............. 324/76.12 |
| 2003/0149457 | A1 | | 8/2003 | Tcheng et al. |
| 2006/0152630 | A1 | | 7/2006 | Miyazawa |
| 2007/0262966 | A1 | * | 11/2007 | Nishimura et al. ........... 345/173 |

FOREIGN PATENT DOCUMENTS

| JP | 57017867 | 1/1982 |
| JP | 2167479 | 6/1990 |
| JP | 5045386 | 2/1993 |
| JP | 7151798 | 6/1995 |
| JP | 2000-278585 | 10/2000 |
| JP | 2002-278585 | 9/2002 |
| JP | 2004-007292 | 1/2004 |
| JP | 2004-139682 | 5/2004 |
| JP | 2005-175743 | 6/2005 |

* cited by examiner

*Primary Examiner* — Jeff Natalini
(74) *Attorney, Agent, or Firm* — Shimokaji & Assoc., P.C.

(57) ABSTRACT

A waveform measuring apparatus includes: a digital filter for removing a large-amplitude changing component from an input signal and for outputting a resultant output signal with a small-amplitude noise component left therein; a window generating section for receiving a differential signal between this input signal and the resultant output signal of the digital filter and for generating a window indicating a position of an edge portion of the differential signal; and a ringing measurement section for extracting, from the resultant output signal of the digital filter, a portion of waveform which is indicated by the window generated by the window generating section and for measuring at least a peak-to-peak amplitude of the portion of waveform.

4 Claims, 10 Drawing Sheets

FIG. 3 (A)
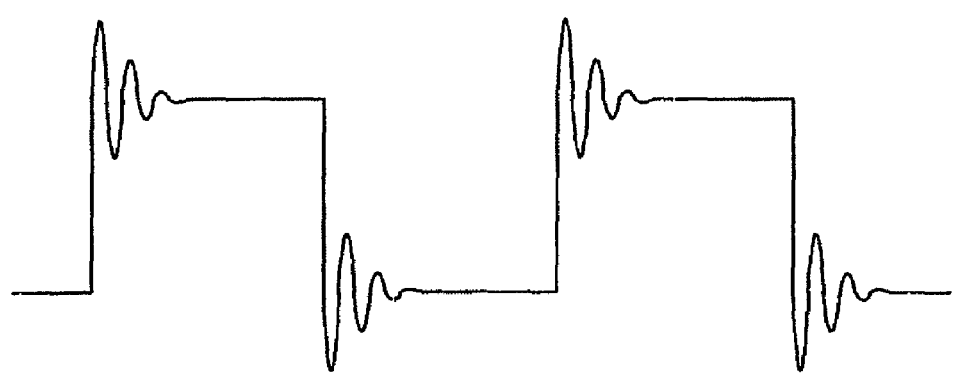
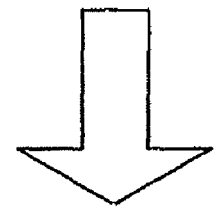
FIG. 3 (B)
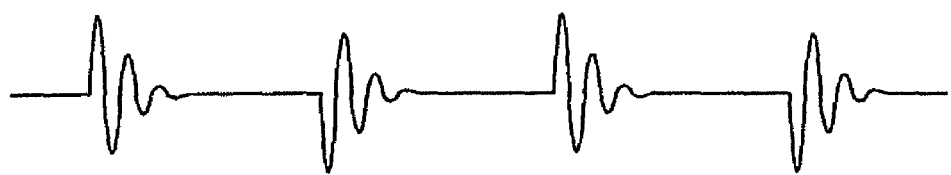

FIG. 4 (A)
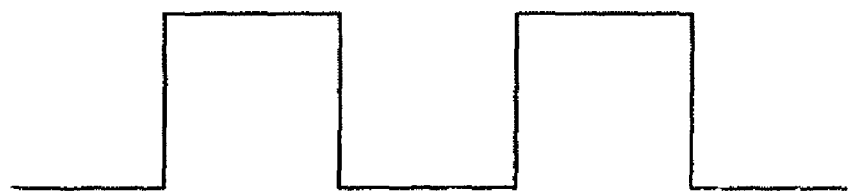
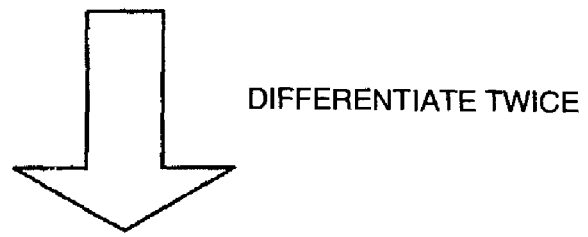
DIFFERENTIATE TWICE
FIG. 4 (B)
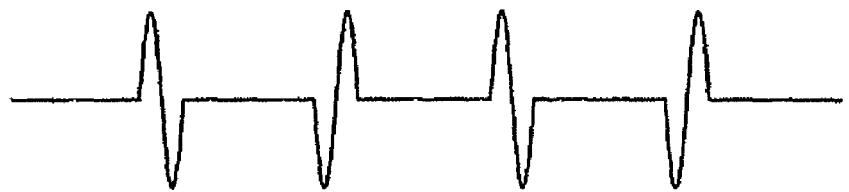

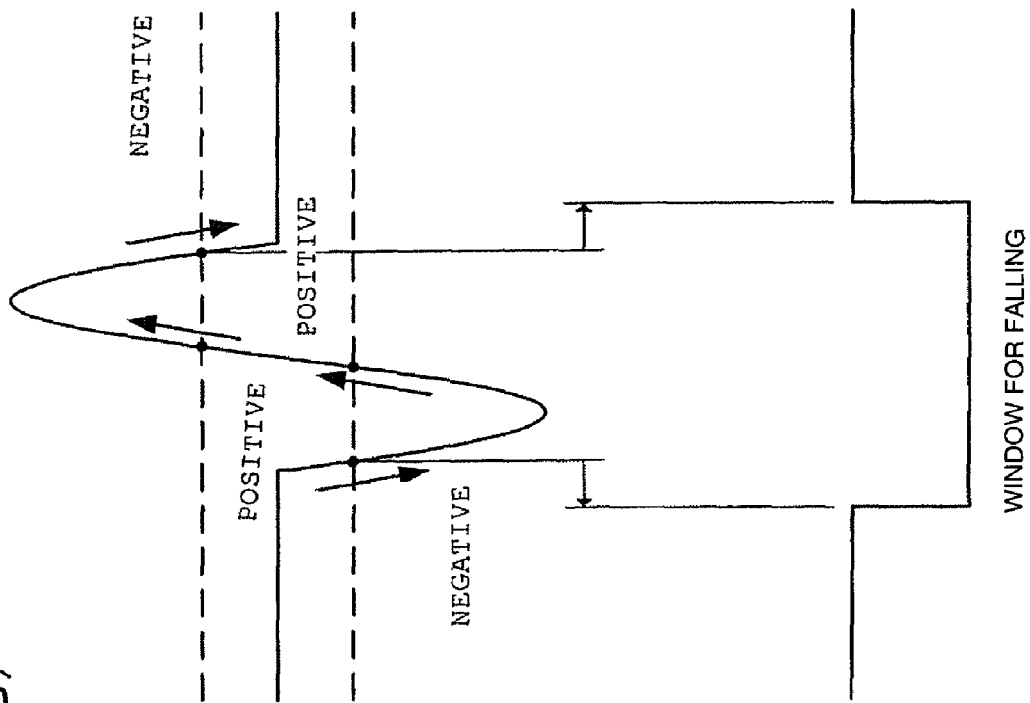
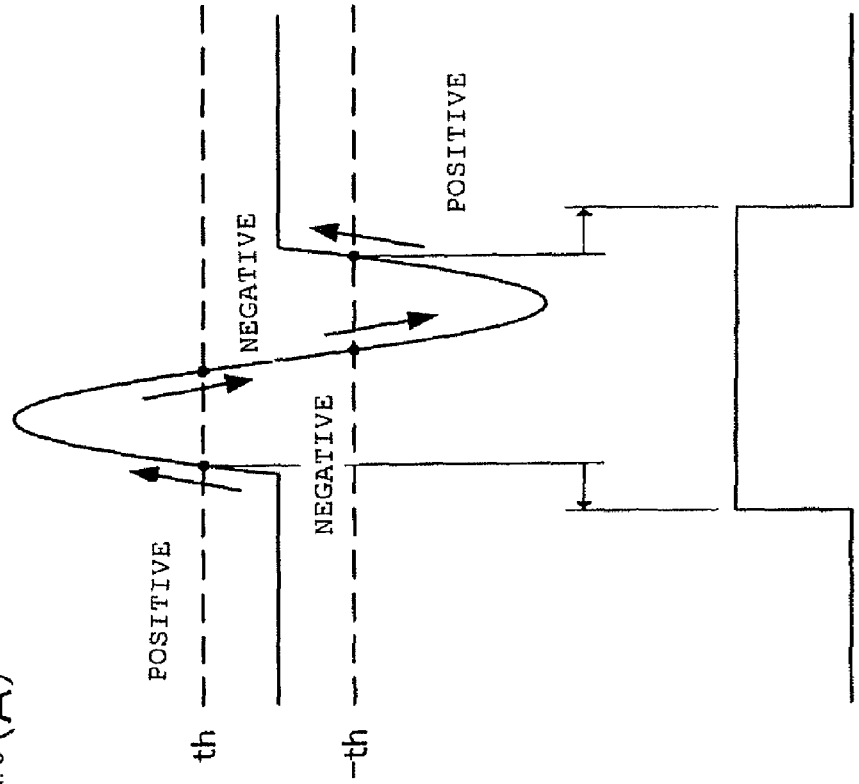

WAVEFORM MEASURING APPARATUS WHEREIN THE PEAK-TO-PEAK AMPLITUDE IS MEASURED

CROSS REFERENCE TO RELATED APPLICATIONS

The present application claims the benefit of priority of a Japanese Patent Application No. 2005-351037, filed Dec. 5, 2005 with the Japan Patent Office, the content of which is incorporated herein by reference in its entirety.

FIELD OF THE INVENTION

The present invention relates to an apparatus and a method for measuring the waveform of an electric signal. In particular, the present invention relates to an apparatus and a method for measuring a waveform including ringing.

BACKGROUND OF THE INVENTION

In tests for various electronic instruments and electrical instruments, waveforms of electric signals are generally measured. In this waveform measurement, there are cases where a waveform called ringing needs to be measured. Ringing is an undulating waveform caused in such a case where a signal, such as a square wave, which changes steeply, passes through an electric network. Ringing is caused by inductance of an interconnection, a shortage of a transmission bandwidth, and the like.

FIG. 10 is a view showing an example of a waveform including ringing.

As shown in FIG. 10, in a waveform containing ringing, an overshoot or an undershoot occurs in an edge portion of the waveform including ringing, and the waveform undulates.

The waveform of an electric signal is measured using a measuring device such as an oscilloscope. An overshoot ($\alpha$ in FIG. 10) and an undershoot of a signal can be measured with an ordinary measuring device of this type. However, the peak-to-peak amplitude ($\beta$ in FIG. 10) of ringing (e.g., see TDS3000B Series User Manual, P 3-44 to P 3-46, Tektronix, hereinafter referred to as Non-Patent Document 1) is not measured with the ordinary measuring device.

As described above, in a case where ringing is measured in the measurement of the waveform of an electric signal, an overshoot and an undershoot of the signal can be measured with a conventional measuring device. However, the peak-to-peak amplitude of the ringing cannot be measured with the conventional measuring device. Accordingly, even in a case where the peak-to-peak amplitude of this ringing is desired to be measured, such as a case where an attempt is made to analyze a cause of the ringing, such a measurement cannot be performed with the conventional measuring device.

SUMMARY OF THE INVENTION

The present invention has been made in view of the above-described technical problem. An object of the present invention is to realize the measurement of various characteristics including the peak-to-peak amplitude with regard to ringing in the measurement of the waveform of the electric signal.

The present invention for achieving the above-described object is realized as a waveform measuring apparatus configured as follows. This apparatus includes: a digital filter for removing a large-amplitude changing component from an input signal and for outputting a resultant output signal with a small-amplitude noise component left therein; a window generating section for receiving a differential signal between this input signal and the resultant output signal of the digital filter and for generating a window indicating a position of an edge portion of the differential signal; and a ringing measurement section for extracting, from the resultant output signal of the digital filter, a portion of waveform indicated by the window generated by the window generating section and for measuring at least a peak-to-peak amplitude of the portion of waveform.

Alternatively, this waveform measuring apparatus may be configured to include: a first digital filter for removing a large-amplitude changing component from an input signal and for outputting a first resultant output signal with a small-amplitude noise component left therein; a second digital filter for removing the small-amplitude noise component from the input signal and for outputting a second resultant output signal with the large-amplitude changing component left therein; a window generating section for receiving the second resultant output signal of the second digital filter and for generating a window indicating a position of an edge portion of the second resultant output signal; and a ringing measurement section for extracting, from the first resultant output signal of the first digital filter, a portion of waveform indicated by the window generated by the window generating section and for measuring at least a peak-to-peak amplitude of the portion of waveform.

To be more specific, in these waveform measuring apparatuses, the first and second digital filters can be realized by the following $\epsilon$ filters. The $\epsilon$ filter for the first digital filter removes a component, which has amplitude larger than a fixed value, from the input signal including waveform components which have different amplitudes, and outputs the first resultant output signal with a component having amplitude of not larger than the fixed value left therein. The $\epsilon$ filter for the second digital filter removes a component, which has amplitude of not larger than the fixed value, from the input signal including waveform components which has different amplitudes, and outputs the second resultant output signal with a component having amplitude larger than the fixed value left therein. The window generating section generates the window by differentiating the second resultant output signal twice and by sectioning an obtained waveform at predetermined thresholds.

The present invention for achieving the above-described object is also considered as a method of measuring a waveform using an apparatus configured as described above. Furthermore, the present invention is also realized as a program for controlling an internal computer of the above-described waveform measuring apparatus to realize functions of the above-described elements. This program can be provided by distributing the program in a state of being stored on a magnetic or optical disk, on a semiconductor memory, and/or on other recording media, and/or by delivering the program directly and/or via a network.

BRIEF DESCRIPTION OF THE DRAWINGS

For a more complete understanding of the present invention and the advantage thereof, reference is now made to the following description taken in conjunction with the accompanying drawings.

FIGS. 3A and 3B are demonstrative illustrations showing a situation in which ringing components of a waveform are extracted using the ε filter of FIG. 2;

FIGS. 4A and 4B are demonstrative illustrations showing a waveform obtained by differentiating a square wave twice;

FIGS. 5A and 5B are demonstrative illustrations showing situations in which a window used in the embodiment is generated from the second-derivative waveform;

DETAILED DESCRIPTION OF THE PREFERRED EMBODIMENTS

Hereinafter, various embodiments for carrying out the present invention will be described in detail with reference to accompanying drawings.

Figure 1:
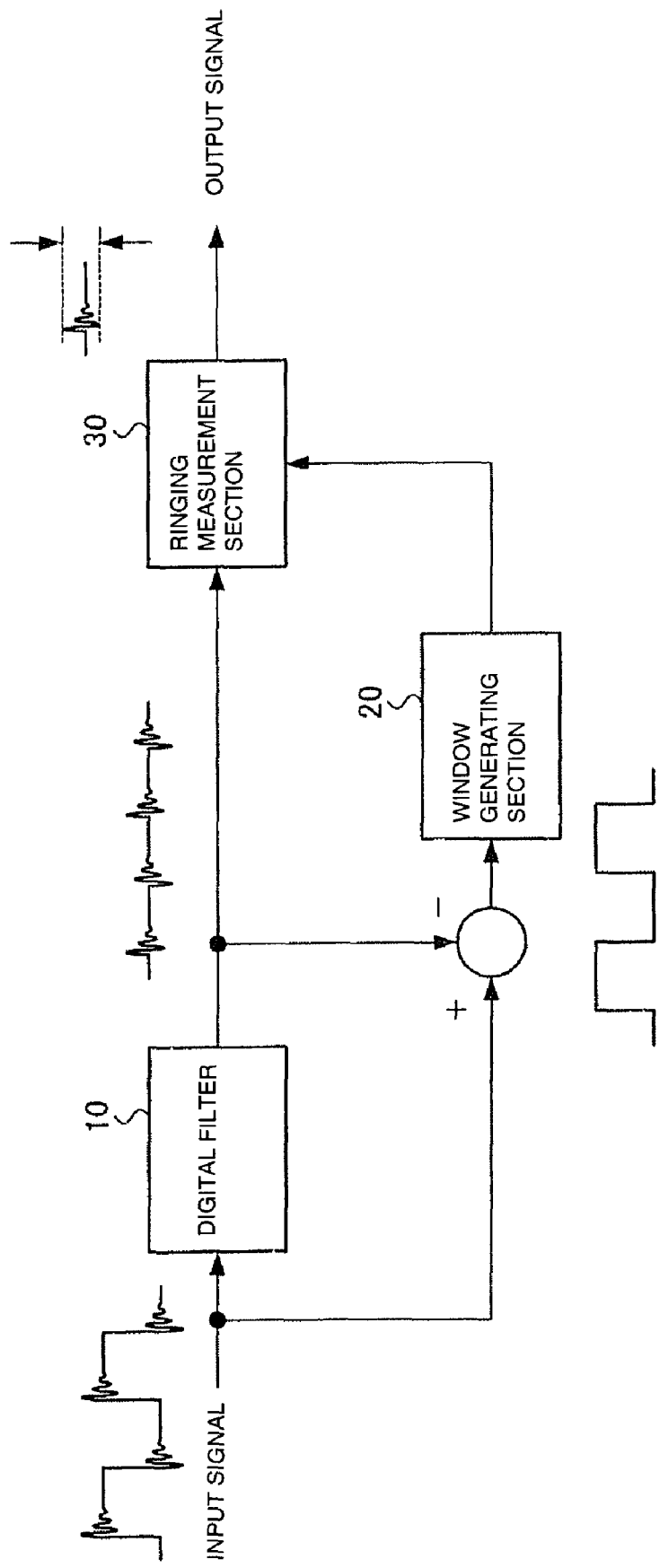
FIG. 1 is a demonstrative illustration showing a configuration of a waveform measuring apparatus according to an embodiment of the present invention.

FIG. 1 is a demonstrative illustration showing a configuration of a waveform measuring apparatus according to an embodiment of the present invention.

As shown in FIG. 1, the waveform measuring apparatus of this embodiment includes: a digital filter 10 for extracting ringing components from a waveform (input signal), which is to be measured, and which is inputted by signal input means of this apparatus; a window generating section 20 for generating a window for waveform measurement; and a ringing measurement section 30 for measuring ringing.

The digital filter 10 may be a non-linear filter used to separate small-amplitude random noise components from a signal. For example, a ε filter as described in Japanese Patent Application No. 2002-278585 may be used. However, the present invention is not limited in this respect and other types of suitable filters may be used as well. This ε filter may have characteristics such that a large-amplitude changing component from an input signal may be removed by the filter to output a resultant signal with small-amplitude random noise components left therein. The characteristics of the ε filter may be represented by the following expression:

$$y = x \text{ when } -\epsilon \leq x \leq \epsilon$$

$$y = 0 \text{ when } x < -\epsilon \text{ or } x > \epsilon \quad (1)$$

Incidentally, a value of ε can be appropriately set according to the amplitude of small-amplitude random noise components to be extracted.

Figure 2:
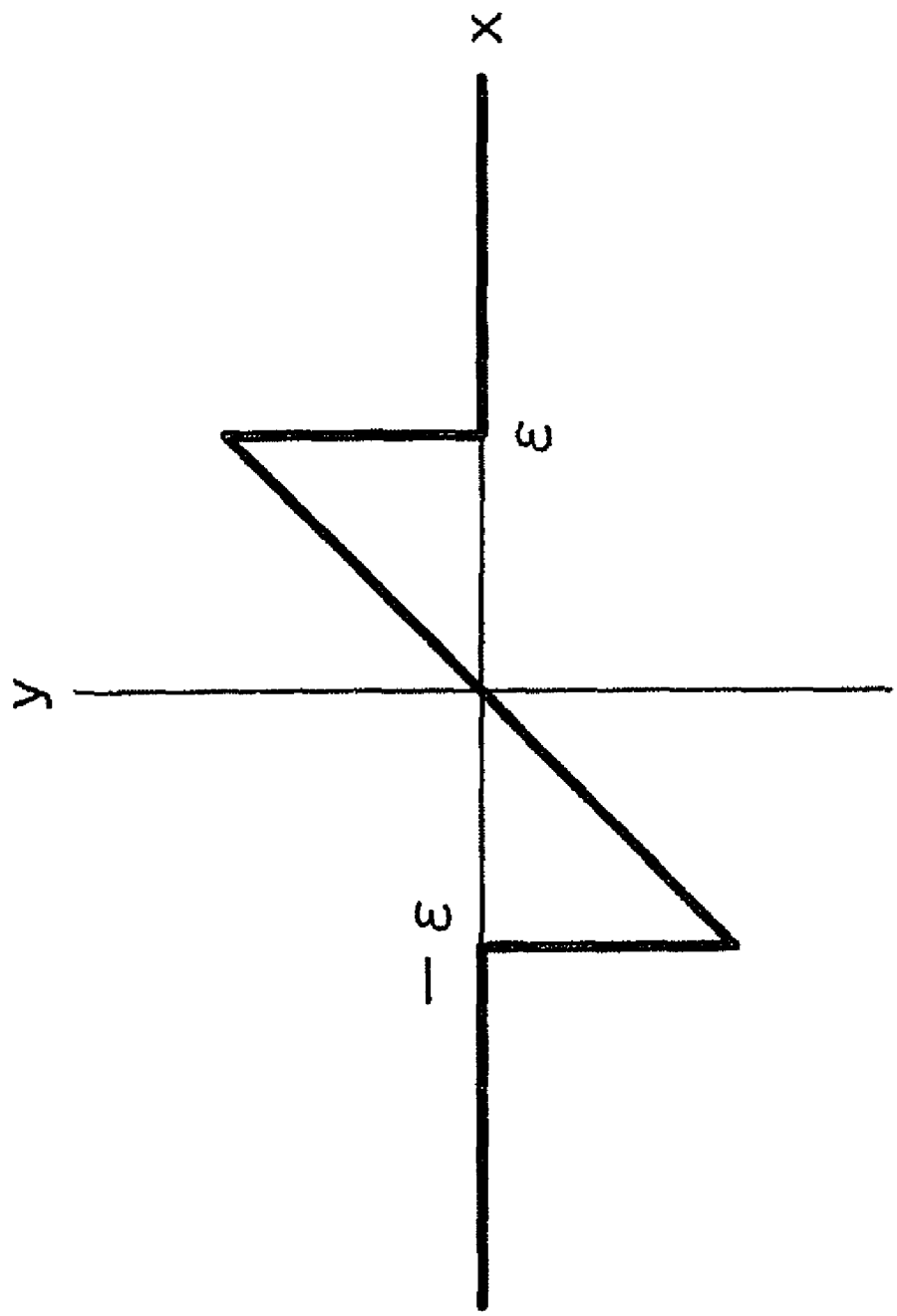
FIG. 2 is a demonstrative illustration showing characteristics of a $\epsilon$ filter used in the embodiment.

FIG. 2 is a demonstrative illustration showing the characteristics of the ε filter which are represented by expression (1), and FIGS. 3A and 3B are demonstrative illustrations showing the extraction of ringing components in a waveform using the ε filter of FIG. 2. The signal shown in FIG. 3A is a square wave in which ringing components are included in edge portions thereof.

The characteristics of the ε filter represented by expression (1) are shown in FIG. 2. According to one embodiment, the value of ε may be a value smaller than the amplitude of the change in the square wave and larger than the amplitude of the ringing components. When the signal shown in FIG. 3A is processed using this ε filter, steep and large-amplitude changing components of the square wave may be substantially eliminated, and only the ringing components are extracted, as shown in FIG. 3B.

The window generating section 20 generates a window for bringing a focus on the waveform of one burst of ringing of ringing components of an input signal which are extracted by the digital filter 10. In the waveform of the signal passed through the above-described digital filter 10, a large-amplitude changing component is removed. However, the waveform of ringing caused at the time of the rising thereof and the waveform of ringing caused at the time of the falling thereof are mixed in with each other, and are repeated. Generally, the waveform of ringing caused at the time of the rising thereof and the waveform of ringing caused at the time of the falling thereof are different from each other. Accordingly, in order to measure the peak-to-peak amplitude of the waveform of ringing, the waveform of a single burst of ringing may need to be extracted from the output signal of this digital filter 10. For this reason, by use of the large-amplitude changing component removed by the digital filter 10, the window generating section 20 generates windows for identifying where individual pieces of ringing occur. A method of generating such windows, according to one embodiment, is described as follows.

The window generating section 20 first receives the difference between the input signal and the output signal of the digital filter 10, and differentiates this differential signal twice. As described above, the output signal of the digital filter 10 is made of ringing components obtained by removing the large-amplitude changing component from the input signal. Hence, the difference between this output signal and the input signal is an original waveform (square wave in the example shown in FIGS. 3A and 3B) obtained by removing the ringing components from the input signal.

FIGS. 4A and 4B are demonstrative illustrations showing a waveform (FIG. 4B) obtained by differentiating a square wave (FIG. 4A) twice.

Next, the window generating section 20 calculates windows indicating edge portions of this differential signal on the basis of the waveform (hereinafter referred to as a second-derivative waveform) which is obtained by differentiating the inputted differential signal twice.

Referring to FIGS. 5A and 5B which are demonstrative illustrations showing situations where windows are generated from the second-derivative waveform, a method of calculating windows will be described specifically. Incidentally, the differential signal is assumed to be a square wave. However, a person skilled in the art will appreciate that embodiments of the present invention may also apply to other shapes of waveforms such as, for example, a trapezoidal waveform.

As shown in FIGS. 5A and 5B, the window generating section 20 sections the generated second-derivative waveform at predetermined thresholds "th" and "−th." Then, on the bases of the states of signal points before and after the signal points at the thresholds set as criteria, the positions of rising edges of the square wave and of the positions of falling edges thereof are distinguished from each other. Specifically, as shown in FIG. 5A, in a case where two points at "th" and two points at "−th" appear, and where the respective directions of the waveform at these points are positive, negative, negative, and positive, this is a waveform obtained from a rising edge. On the other hand, as shown in FIG. 5B, in a case where two points at "−th" and two points at "th" appear, and where the respective directions of the waveform at these points are negative, positive, positive, and negative, this is a waveform obtained from a falling edge.

As described above, windows for rising edges of the square wave and windows for falling edges thereof are calculated. Window generating section 20 makes it possible to appropriately change (expand or shrink) the sizes of the windows, which are obtained as described above according to the length of ringing.

FIG. 5B shows a situation in which the size of the window obtained from the second-derivative waveform is expanded. Note that the waveforms of the windows indicating a rising edge, and a falling edge, of the square wave are shown in FIGS. 5A and 5B. However, the windows do not need to be outputted as an actual waveform, and may be passed from the window generating section 20 to the ringing measurement section 30 simply as information (position information).

Using the window generated by the window generating section 20, the ringing measurement section 30 brings a focus on the waveform of a single burst of ringing in the output signal of the digital filter 10, and measures characteristics, i.e., the peak-to-peak amplitude, length, period, and the like thereof. As described above, the waveform of ringing caused at the time of the rising of a signal and the waveform of ringing caused at the falling thereof are generally different from each other. For this reason, it is preferable that individual pieces of ringing be extracted and measured separately.

Characteristics of the extracted single burst of ringing can be measured with an existing apparatus such as an oscilloscope shown in Non-Patent Document 1.

Figure 6:
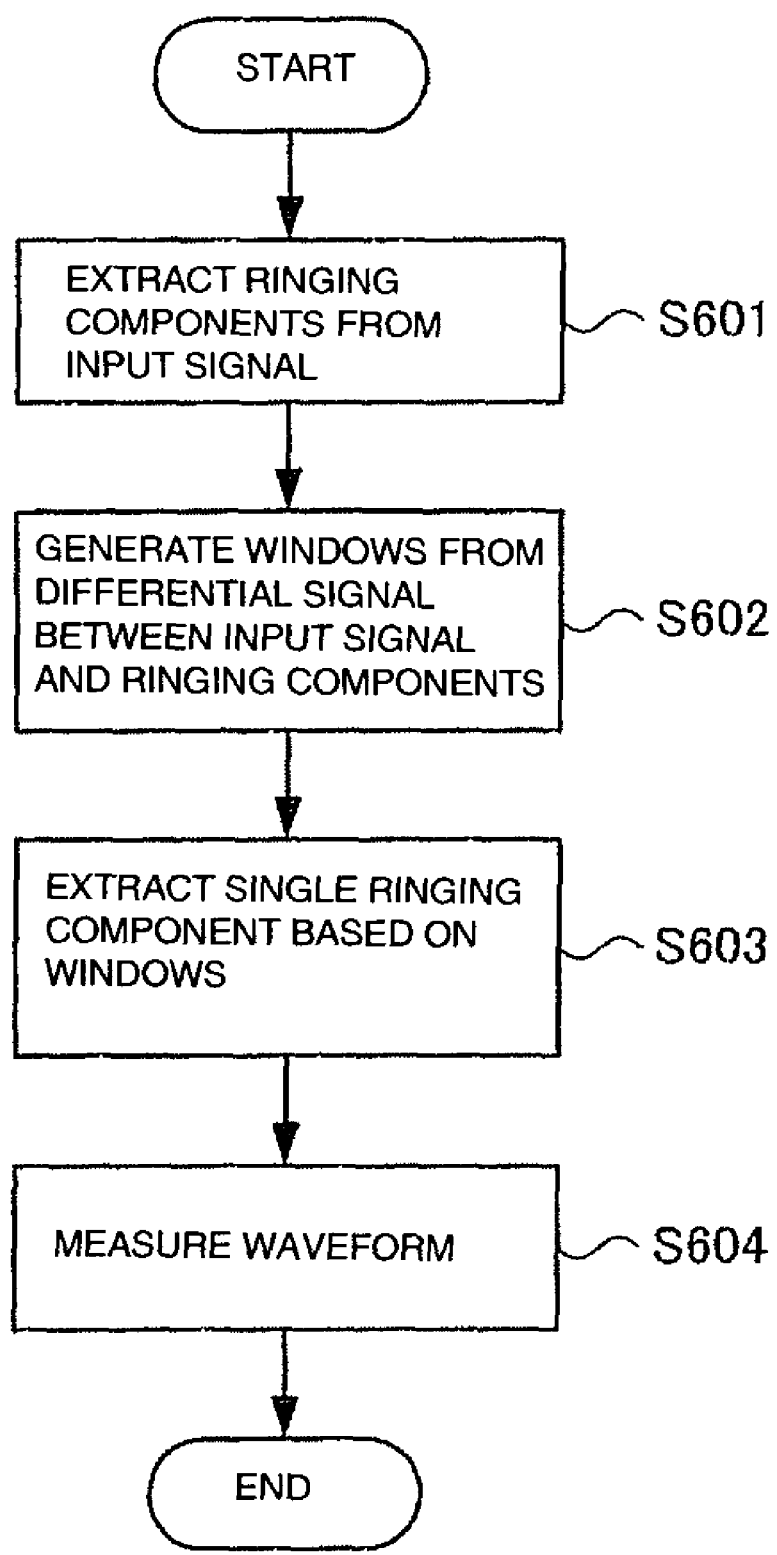
FIG. 6 is a simplified flowchart showing an overall flow of a method of measuring ringing using a waveform measuring apparatus of the embodiment.

FIG. 6 is a flowchart showing the overall flow of a method of measuring ringing using the waveform measuring apparatus of this embodiment which is configured as described above. One embodiment of the present invention may also include a computer program stored in a computer, preferably inside a measuring apparatus for measuring a waveform of a signal (internal computer). The computer program may cause the internal computer to function as described in the detailed steps of FIG. 6. A person skilled in the art will appreciate that the computer may also be any types of data processing unit.

As shown in FIG. 6, an input signal is first inputted to the digital filter 10, and ringing components of the waveform of the input signal are extracted (step 601). Next, the difference between the input signal and an output signal (ringing components obtained in step 601) of the digital filter 10 is inputted to the window generating section 20, and windows, which indicate the positions of edge portions of this differential signal (step 602), are generated. Thereafter, in the ringing measurement section 30, a single ringing component is extracted from the output signal of the digital filter 10 based on the windows (step 603). Accordingly, waveform is measured. (step 604).

In the above-described embodiment, as a scheme for removing the ringing components from the input signal to generate the windows, the difference between the input signal and the output signal of the digital filter 10 is obtained. Alternatively, using a $\epsilon$ filter having characteristics in which the large-amplitude changing component is extracted from the input signal, and which are opposite to those of the digital filter 10, it is made possible to obtain a waveform in which the ringing components are removed directly from the input signal. The configuration of such an apparatus will be described below.

Figure 7:
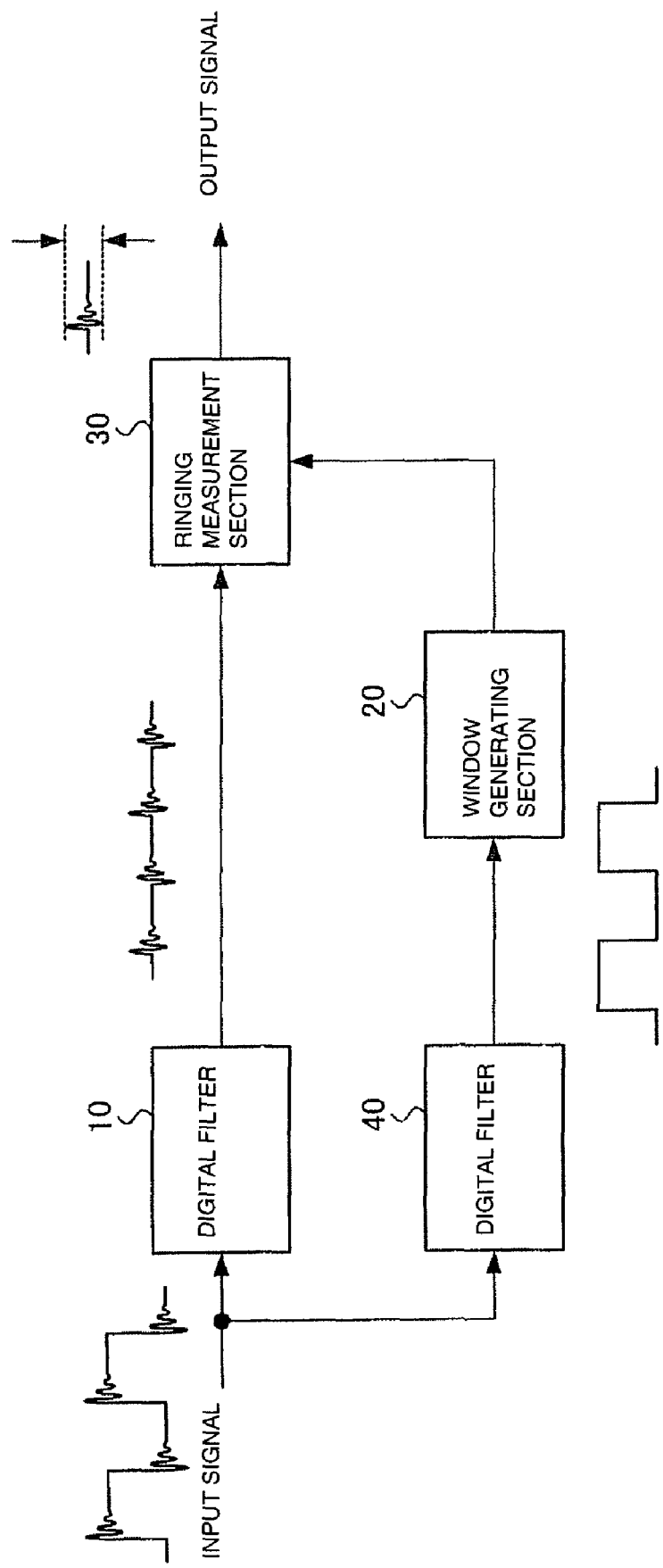
FIG. 7 is a demonstrative illustration showing a configuration of a waveform measuring apparatus according to another embodiment of the present invention.

FIG. 7 is a demonstrative illustration showing the configuration of a waveform measuring apparatus according to another embodiment of the present invention.

As shown in FIG. 7, the waveform measuring apparatus of this embodiment includes: the digital filter 10 for extracting ringing components from a waveform (input signal) which is to be measured, and which is inputted with signal input means of this apparatus; a digital filter 40 for removing the ringing components from the input signal and for extracting a large-amplitude changing component; the window generating section 20 for generating windows for waveform measurement; and the ringing measurement section 30 for measuring ringing.

In the configuration shown in FIG. 7, the digital filter 10, the window generating section 20 and the ringing measurement section 30 are equivalent to those of the waveform measuring apparatus shown in FIG. 1, and are denoted by the same reference numerals. Descriptions thereof will be omitted.

As described above, the digital filter 40 may be realized by a $\epsilon$ filter having characteristics in which small-amplitude random noise components are removed from the input signal to output the resultant signal with a large-amplitude changing component left therein, as opposed to those of the digital filter 10. According to one embodiment, characteristics of this digital filter 40 ($\epsilon$ filter) may be represented by the following expression (2):

$$y=x \text{ when } x<-\epsilon \text{ or } x>\epsilon$$

$$y=0 \text{ when } -\epsilon \leq x \leq \epsilon \tag{2}$$

Figure 8:
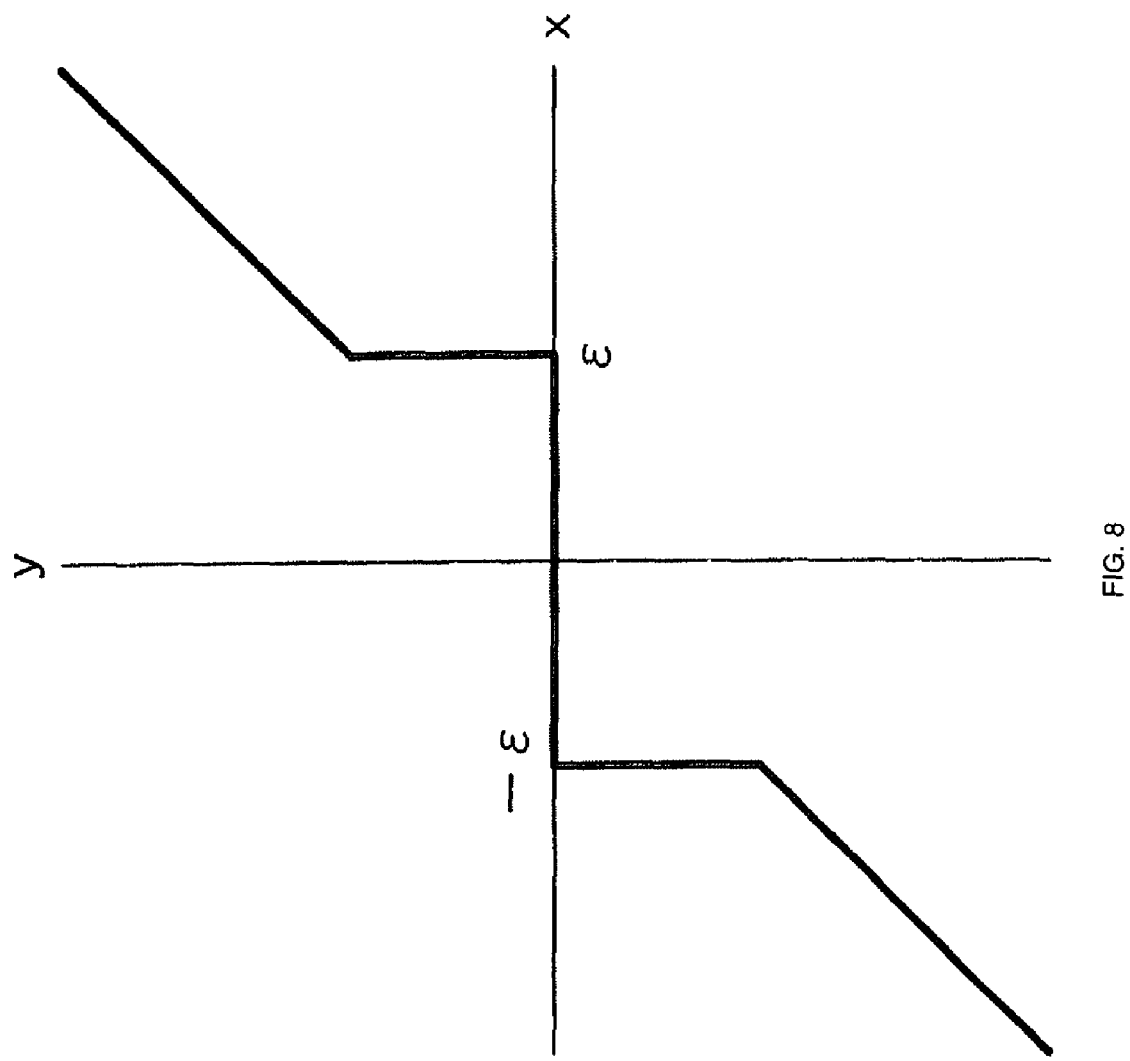
FIG. 8 is a demonstrative illustration showing characteristics of a second ε filter used in the embodiment.

FIG. 8 is a demonstrative illustration showing the characteristics of the $\epsilon$ filter which are represented by expression (2).

The use of the digital filter 40 makes it possible to obtain directly, from an input signal, an original waveform (e.g., square wave) in which ringing components are removed, and to supply the original waveform to the window generating section 20. By purposely using the $\epsilon$ filter different from that of the digital filter 10, ringing components can be measured more accurately in a case where, for example, small-amplitude (however, amplitude larger than that of the ringing components) noises other than the ringing components are superimposed on the input signal. That is, in the digital filter 10, by appropriately selecting the value of $\epsilon$, only the ringing components of the input signal are extracted. In the digital filter 40, all of the noise components are removed from the input signal to leave only the original waveform. Accordingly, the window generating section 20, which receives the output of the digital filter 40, makes it possible to generate windows from the original waveform without noise.

Figure 9:
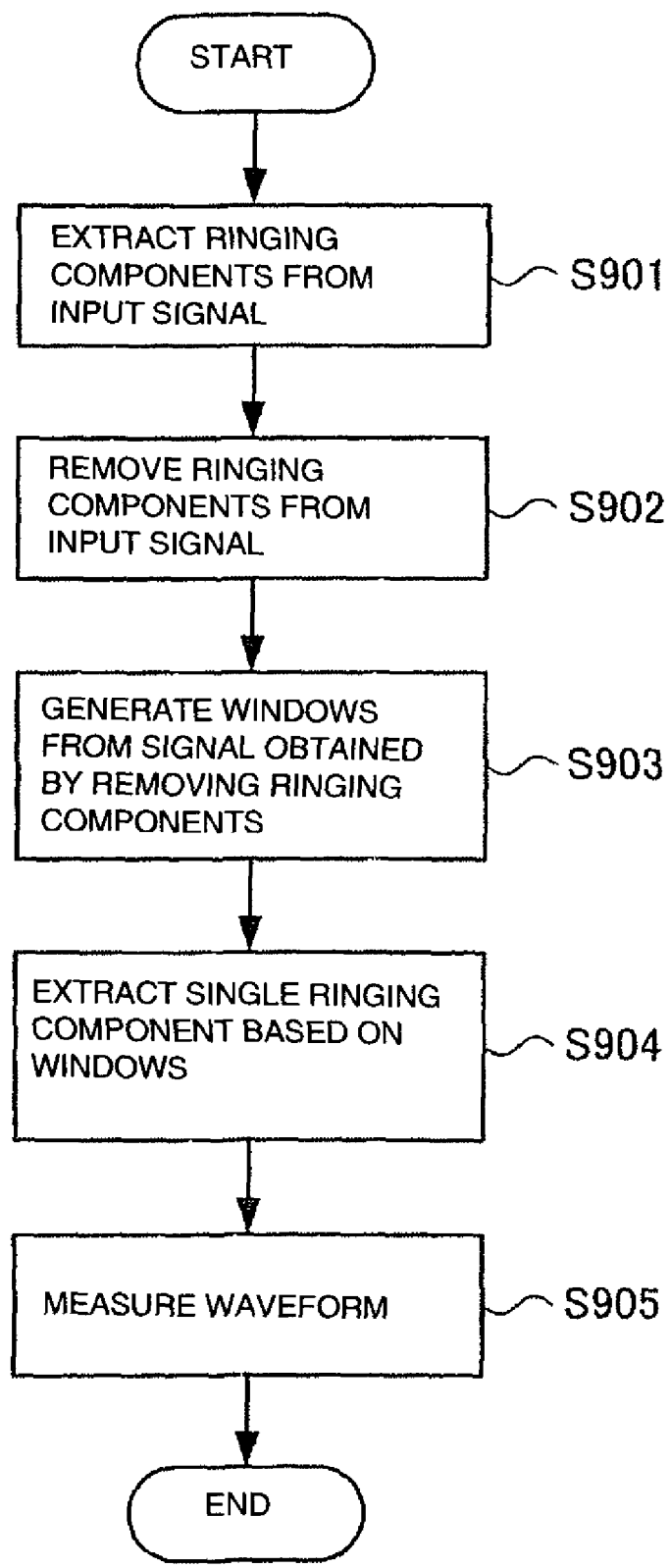
FIG. 9 is a simplified flowchart showing an overall flow of a method of measuring ringing with the waveform measuring apparatus of the embodiment.
Figure 10:
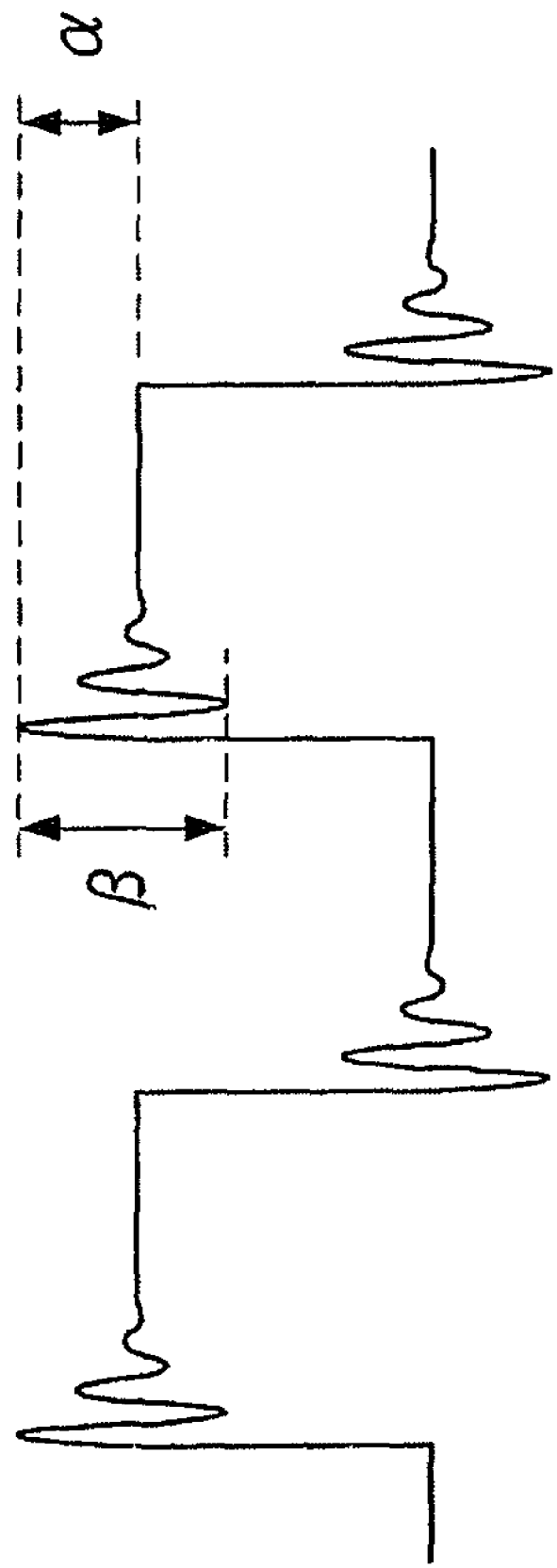
FIG. 10 is a demonstrative illustration showing an example of a waveform including ringing.

FIG. 9 is a flowchart showing the overall flow of a method of measuring ringing using the waveform measuring apparatus of this embodiment which is configured as shown in FIG. 7. One embodiment of the present invention may also include a computer program stored in a computer, preferably inside a measuring apparatus for measuring a waveform of a signal (internal computer). The computer program may cause the internal computer to function as described in the detailed steps of FIG. 9. A person skilled in the art will appreciate that the computer may also be any types of data processing unit.

As shown in FIG. 9, an input signal is first inputted to the digital filter 10, and ringing components of the waveform of the input signal are extracted (step 901). Meanwhile, this input signal is also inputted to the digital filter 40, and various noises including ringing components are removed from the input signal (step 902). Then, an output signal (signal from which noises are removed) of this digital filter 40 is inputted to the window generating section 20, and windows, which indicate the positions of edge portions of this signal (step 903), are calculated. Finally, in the ringing measurement section 30, a single ringing component is extracted from the output signal of the digital filter 10 based on these windows (step 904). Accordingly, waveform is measured (step 905).

Incidentally, FIG. 9 shows steps separately in such a manner that signal processing by the digital filter 10 and signal processing by the digital filter 40 are sequentially performed. However, these processings are independent. For example, any one of the two processings may be executed first, or these processings may be performed concurrently.

According to the present invention configured as described above, it is made possible to extract ringing components from a signal, and to measure various characteristics including peak-to-peak amplitude thereof in the measurement of the waveform of an electric signal.

Although the preferred embodiments of the present invention have been described in detail, it should be understood that various changes, substitutions and alternations can be made therein without departing from spirit and scope of the inventions as defined by the appended claims.

What is claimed is:

1. A waveform measuring apparatus comprising:
    a first digital filter that removes a large-amplitude changing component from an input signal and outputs a resultant output signal with a remaining small-amplitude noise component left therein;
    a second digital filter that removes the small-amplitude noise component from the input signal and outputs a resultant output signal with a remaining large-amplitude changing component left therein;
    a window generating a section that inputs the output signal of the first digital signal and that generates a window which indicates a position of an edge portion of said signal of the second digital filter; and
    a ringing measurement section that extracts, from the output signal of the first digital filter, a portion indicated by the window generated by the window generating section, and that measures at least a peak-to-peak amplitude of an extracted waveform.

2. The waveform measuring apparatus according to claim 1, wherein
    the first digital filter is an $\epsilon$ filter that removes a component, which has amplitude larger than a fixed value, from a signal including waveform components having different amplitudes, and that outputs a remaining component having amplitude not larger than the fixed value;
    the second digital filter is an $\epsilon$ filter that removes a component, which has amplitude not larger than the fixed value, from a signal including waveform components having different amplitudes, and for outputting a remaining component having amplitude larger than the fixed value.

3. The waveform measuring apparatus according to claim 1, wherein the window generating section generates the window by differentiating the output signal of the second digital filter twice and by sectioning an obtained waveform at a predetermined threshold.

4. A program for causing an internal computer of a measuring apparatus for measuring a waveform of a signal to function as:
    means for extracting a small-amplitude noise component from an input signal inputted by input means of the measuring apparatus;
    means for removing the small-amplitude noise component from the input signal;
    means for generating a window, which indicates a position of an edge portion of a signal wherein the small-amplitude noise component has been removed; and
    means for extracting a portion, which is indicated by the window, from the small-amplitude noise component extracted from the signal to be processed, and for measuring at least a peak-to-peak amplitude of the extracted waveform.

* * * * *